United States Patent
Tsou et al.

(10) Patent No.: US 11,480,720 B2
(45) Date of Patent: Oct. 25, 2022

(54) FILTERING STRUCTURE FOR AN INFRARED CUT FILTER

(71) Applicant: KingRay Technology Co., LTD., Zhudong Township (TW)

(72) Inventors: Cheng-Hsing Tsou, Zhudong Township (TW); Wei-Hao Cheng, Zhudong Township (TW); Pei-Yuan Ni, Zhudong Township (TW)

(73) Assignee: KingRay Technology Co., LTD., Zhudong Township (TW)

( * ) Notice: Subject to any disclaimer, the term of this patent is extended or adjusted under 35 U.S.C. 154(b) by 0 days.

(21) Appl. No.: 17/406,364

(22) Filed: Aug. 19, 2021

(65) Prior Publication Data
US 2022/0146723 A1  May 12, 2022

(30) Foreign Application Priority Data
Nov. 12, 2020  (TW) ................. 109135981

(51) Int. Cl.
| | |
|---|---|
| *G02B 5/20* | (2006.01) |
| *G02B 1/04* | (2006.01) |
| *C23C 14/06* | (2006.01) |
| *C23C 14/10* | (2006.01) |
| *C23C 14/08* | (2006.01) |
| *G02B 5/22* | (2006.01) |

(52) U.S. Cl.
CPC .......... *G02B 5/208* (2013.01); *C23C 14/0694* (2013.01); *C23C 14/083* (2013.01); *C23C 14/10* (2013.01); *G02B 1/04* (2013.01); *G02B 5/223* (2013.01)

(58) Field of Classification Search
CPC .......... G02B 5/208; G02B 1/04; G02B 5/223; G02B 5/20; C23C 14/0694; C23C 14/083; C23C 14/10
See application file for complete search history.

(56) References Cited

U.S. PATENT DOCUMENTS

| | | |
|---|---|---|
| 8,693,089 B2 | 4/2014 | Saitoh et al. |
| 9,445,017 B2 | 9/2016 | Konishi et al. |
| 9,570,490 B2 | 2/2017 | Kakiuchi et al. |
| 9,835,779 B2 | 12/2017 | Tatemura |
| 10,082,611 B2 | 9/2018 | Shiono et al. |
| 10,228,500 B2 | 3/2019 | Ooi et al. |
| 10,310,150 B2 | 6/2019 | Sugiyama et al. |
| 10,345,498 B2 | 7/2019 | Yamamoto et al. |
| 10,386,555 B2 | 8/2019 | Kim et al. |
| 10,495,796 B2 | 12/2019 | Shiono et al. |
| 10,598,834 B2 | 3/2020 | Shiono et al. |
| 10,605,969 B2 | 3/2020 | Ishido et al. |
| 10,670,785 B2 | 6/2020 | Kim et al. |

(Continued)

OTHER PUBLICATIONS

US 8,649,087 B2, 02/2014, Saitoh et al. (withdrawn)

*Primary Examiner* — Balram T Parbadia
(74) *Attorney, Agent, or Firm* — MG Miller Intellectual Property Law LLC

(57) ABSTRACT

An infrared-cut filter structure is disclosed. The infrared-cut filter structure uses a glass substrate having an upper side and a lower side, with a first multilayer film formed on the upper side and a second multilayer film formed on the lower side so that the infrared-cut filter can effectively filter out infrared light and transmit visible light to produce normal colored images.

9 Claims, 7 Drawing Sheets

(56) References Cited

U.S. PATENT DOCUMENTS

| | | |
|---|---|---|
| 10,746,908 B2 | 8/2020 | Ooi et al. |
| 10,767,030 B2 | 9/2020 | Choi et al. |
| 10,809,428 B2 | 10/2020 | Shiono et al. |
| 2012/0212809 A1* | 8/2012 | Chang .................... G02B 5/208 359/359 |
| 2013/0094075 A1* | 4/2013 | Saitoh .................. G02B 5/0833 359/350 |
| 2013/0235452 A1* | 9/2013 | You ........................ G02B 13/14 359/356 |
| 2015/0346403 A1 | 12/2015 | Jidai et al. |
| 2016/0018576 A1* | 1/2016 | Yamamoto ............. G03B 11/00 359/359 |
| 2017/0017023 A1* | 1/2017 | Sugiyama ......... H01L 27/14618 |
| 2018/0275315 A1 | 9/2018 | Hsieh et al. |
| 2019/0317249 A1* | 10/2019 | Wang .................... G02B 1/115 |
| 2020/0200956 A1 | 6/2020 | Shiono et al. |
| 2020/0209448 A1* | 7/2020 | Rowlands ............... C23C 28/00 |
| 2020/0319386 A1* | 10/2020 | Chen .................. H01J 37/3426 |
| 2021/0255377 A1* | 8/2021 | Liu ..................... C23C 14/3464 |

\* cited by examiner

FILTERING STRUCTURE FOR AN INFRARED CUT FILTER

NOTICE OF COPYRIGHTS AND TRADE DRESS

A portion of the disclosure of this patent document contains material which is subject to copyright or trade dress protection. This patent document may show and/or describe matter that is or may become trade dress of the owner. The copyright and trade dress owner has no objection to the facsimile reproduction by anyone of the patent disclosure, as it appears in the Patent and Trademark Office patent files or records, but otherwise reserves all copyright and trade dress rights whatsoever.

CLAIM OF PRIORITY

This application claims priority to Taiwanese Application No. 109135981, filed Nov. 12, 2020, the contents of which are hereby incorporated by reference in their entirety.

FIELD OF THE EMBODIMENTS

The present disclosure relates to an infrared-cut filter structure, and more particularly an infrared-cut filter structure that can effectively filter out the infrared light and transmit the visible light for producing normal colored images. More particularly, the present disclosure relates to an infrared cut filter structure comprising a glass substrate having an upper side and a lower side, with a first multilayer film on the upper side, and a second multilayer film on the lower side.

BACKGROUND

With the recent development of high-end smartphones, there is an increase in the demand for superior camera modules that produce high-fidelity colored images. Inside a camera module, an infrared-cut filter is commonly placed in front of the CCD or CMOS image sensing component to filter out the unwanted infrared light while transmitting the visible light to produce normal colored images. Thus, the infrared-cut filter is a key component in the design of a high-performance smartphone camera module.

As smartphone screen resolution continues to increase, more stringent requirements are imposed on the performance of the infrared-cut filter, particularly on the color reproductivity and noise-free sharpness of the images produced. More specifically, light waves whose wavelength lies beyond the range of 320 nm to 760 nm, although invisible to the ordinary human eye, are captured by the CCD or CMOS imaging element of the camera module. The involvement of light waves at different wavelength ranges causes the colors of the image produced by the camera module to deviate from the colors seen by the naked eye.

For instance, green plants turn gray, red pictures turn into light red ones and black objects appear to be purple. Consequently, it is vital to leverage high-performance infrared-cut filter so that the original colors are preserved perfectly in the imaging process.

The most commonly known filter structure for an infrared-cut filter, as presented in Taiwan Patent Publication Nos. I557349 and No. I557440, is able to provide a transmittance that is less than but close to 1% over the infrared wavelength range of 850 nm to 1300 nm. Such transmittance range is acceptable for camera modules designed for early cell phones. However, as the phone screen resolution increases, such transmittance range for the infrared-cut filter causes a considerable deviation between the color reproduced by the camera module and the color seen by the naked eye. Thus, the most commonly known infrared-cut filter is not suitable for camera modules designed for current high-end cell phones.

SUMMARY OF THE INVENTION

The present disclosure provides for an infrared-cut filter structure, including a glass substrate having an upper side and a lower side, a first multilayer film on the upper side of the glass substrate and a second multilayer film on the lower side of the glass substrate. In an embodiment, the first multilayer film is formed by alternately stacking a plurality of high-refractive-index layers and a plurality of low-refractive-index layers, preferably such that the first multilayer film has an optical density between OD3~OD7 for infrared light with a wavelength of 900 nm to 1100 nm and an angle of incidence of 0° to 30°. In an embodiment, the second multilayer film is formed by alternately stacking a plurality of high-refractive-index layers and a plurality of low-refractive-index layers, preferably such that the second multilayer film has an optical density between OD3~OD6 for infrared light with a wavelength of 700 nm to 900 nm.

In an embodiment, the glass substrate is a white glass substrate. In an embodiment, the glass substrate is a blue glass substrate. In an embodiment, the glass substrate is a substrate comprising white glass coated with an infrared-absorbing organic film.

In an embodiment, the plurality of high-refractive-index layers of the first multilayer film are each composed of a material selected from the group consisting of: trititanium pentoxide ($Ti_3O_5$), titanium dioxide ($TiO_2$), tantalum pentoxide ($Ta_2O_5$), niobium pentoxide ($Nb_2O_5$), and mixtures thereof.

In an embodiment, the plurality of low-refractive-index layers of the first multilayer film are each composed of a material selected from the group consisting of: silicon dioxide ($SiO_2$), magnesium fluoride ($MgF_2$), and mixtures thereof.

In an embodiment, the plurality of high-refractive-index layers of the second multilayer film are each composed of a material selected from the group consisting of: trititanium pentoxide ($Ti_3O_5$), titanium dioxide ($TiO_2$), tantalum pentoxide ($Ta_2O_5$), niobium pentoxide ($Nb_2O_5$), and mixtures thereof.

In an embodiment, the plurality of low-refractive-index layers of the second multilayer film are each composed of a material selected from the group consisting of: silicon dioxide ($SiO_2$), magnesium fluoride ($MgF_2$), and mixtures thereof.

In an embodiment, the first multilayer film is formed such that it has the structure shown in Table 1 of this disclosure. In an embodiment, the second multilayer film is formed such that it has the structure shown in Table 2 of this disclosure.

BRIEF DESCRIPTION OF THE PREFERRED EMBODIMENTS

In the drawings, like elements are depicted by like reference numerals. The drawings are briefly described as follows.

Figure 1:
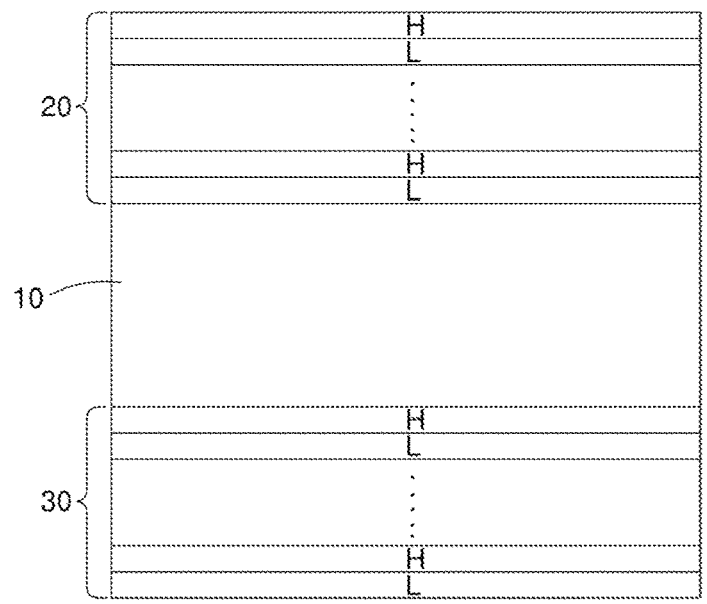
FIG. 1 is a cross-sectional view of an infrared-cut filter according to the present invention.

The present disclosure now will be described more fully hereinafter with reference to the accompanying drawings, which show various example embodiments. However, the present disclosure may be embodied in many different forms and should not be construed as limited to the example embodiments set forth herein. Rather, these example embodiments are provided so that the present disclosure is thorough, complete, and fully conveys the scope of the present disclosure to those skilled in the art. In fact, it will be apparent to those skilled in the art that various modifications and variations can be made in the present invention without departing from the scope or spirit of the invention.

DETAILED DESCRIPTION OF THE PREFERRED EMBODIMENTS

The preferred embodiments of the present invention will now be described with reference to the drawings. Identical elements in the various figures are identified with the same reference numerals.

Reference will now be made in detail to each embodiment of the present invention. Such embodiments are provided by way of explanation of the present invention, which is not intended to be limited thereto in any manner whatsoever. In fact, those of ordinary skill in the art may appreciate upon reading the present specification and viewing the present drawings that various modifications and variations can be made thereto.

An embodiment of the present invention includes an infrared-cut filter structure, with reference to FIG. 1, including a glass substrate 10 having an upper side and a lower side, a first multilayer film 20, and a second multilayer film 30. In an embodiment, the glass substrate 10 preferably has a thickness of 0.1 mm to 1.1 mm. In an embodiment, the glass substrate 10 is white glass. In an embodiment, the glass substrate 10 is blue glass. In an embodiment, the glass substrate 10 is a substrate comprising white glass coated with an organic film, preferably an infrared-absorbing organic film.

Figure 2:
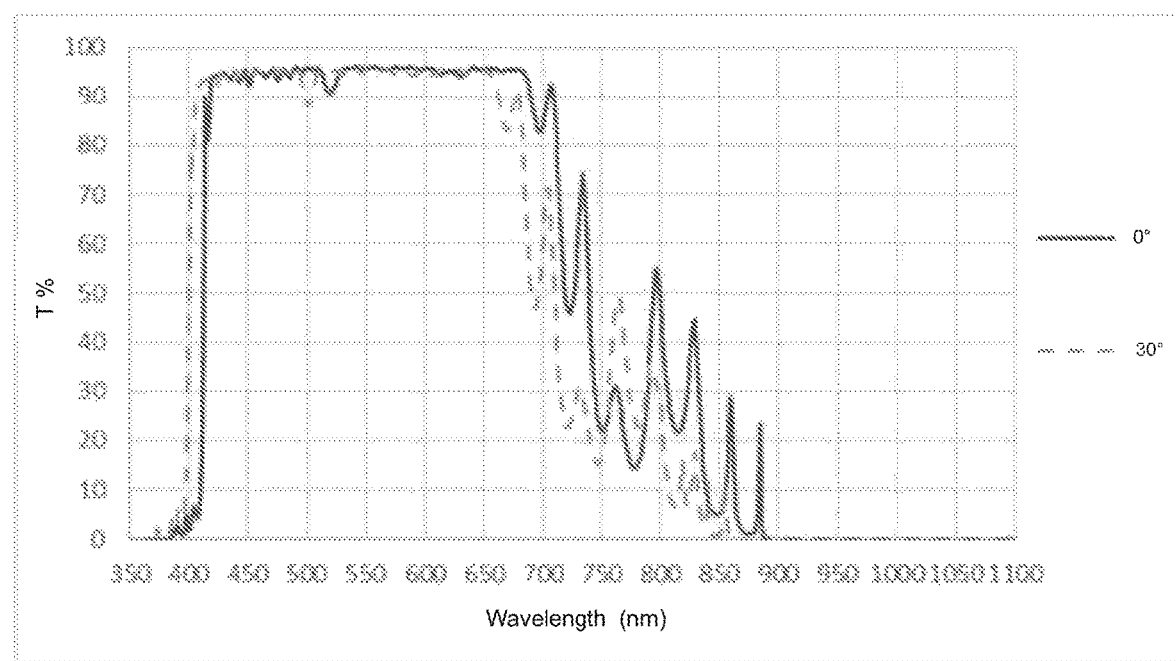
FIG. 2 is a transmittance spectrum diagram of a first multilayer film according to the present invention.
Figure 3:
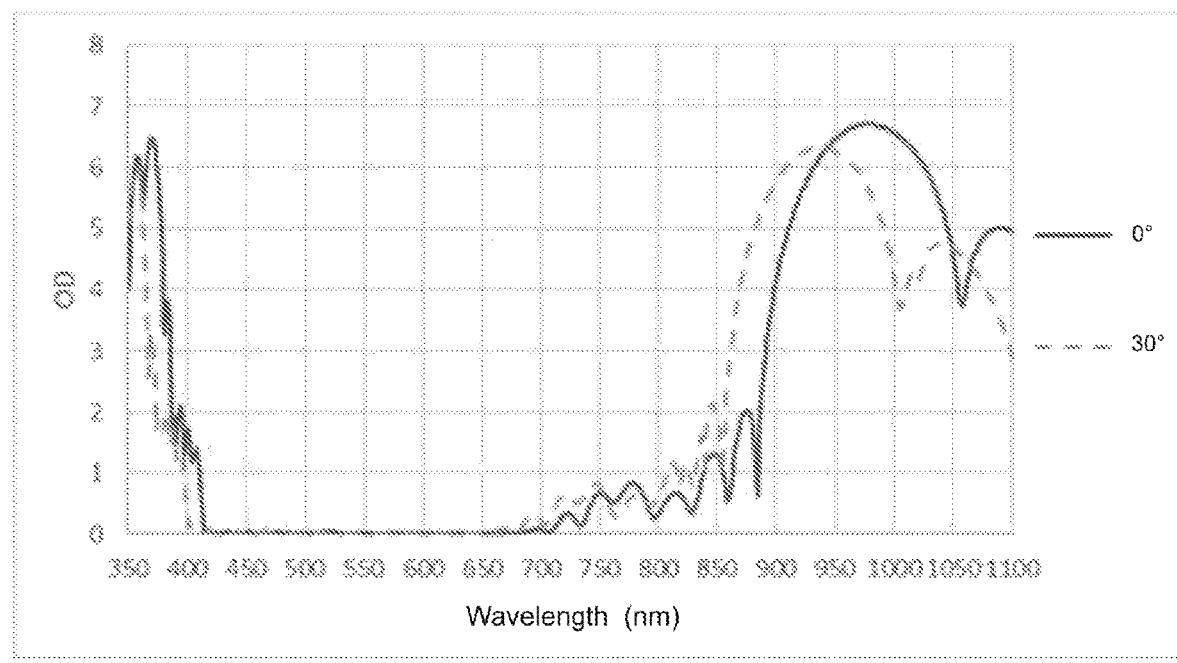
FIG. 3 is an optical density spectrum of a first multilayer film according to the present invention.

In an embodiment, with reference to FIG. 2 and FIG. 3, the first multilayer film 20 is fabricated by the physical vapor deposition (PVD) process. In an embodiment, the first multilayer film is formed on the upper side of the glass substrate 10. In an embodiment, the first multilayer film is formed by stacking alternately a plurality of high-refractive-index layers and a plurality of low-refractive-index layers. In an embodiment, the first multilayer film 20 has an optical density of 3~7 (OD3~OD7) for light with a wavelength range of 900 nm to 1100 nm and an angle of incidence of 0° to 30°.

In an embodiment, the high-refractive-index material is an oxide comprising one of trititanium pentoxide (Ti3O5), titanium dioxide (TiO2), tantalum pentoxide (Ta2O5), niobium pentoxide (Nb2O5) or a mixture thereof. In an embodiment, the high-refractive-index material has a refractive index of 2~3, and preferably has an extinction coefficient close to zero for light with a wavelength of 300 nm to 1100 nm.

In an embodiment, the low-refractive-index material is an oxide comprising one of silicon dioxide (SiO2), magnesium fluoride (MgF2) or a mixture thereof. In an embodiment, the low-refractive-index material has a refractive index of 1.3~2, and preferably has an extinction coefficient close to zero for light with a wavelength of 300 nm to 1100 nm. In an exemplary embodiment of the present invention, the first multilayer film 20 is formed so that the structure of the first multilayer film is as shown in the following table:

TABLE 1

| Layer No. | Material | Thickness (nm) |
| --- | --- | --- |
| 1 | $Nb_2O_5$ | 12.74 |
| 2 | $SiO_2$ | 32.84 |
| 3 | $Nb_2O_5$ | 96.19 |
| 4 | $SiO_2$ | 10.31 |
| 5 | $Nb_2O_5$ | 8.45 |
| 6 | $SiO_2$ | 157.12 |
| 7 | $Nb_2O_5$ | 106.84 |
| 8 | $SiO_2$ | 183.37 |
| 9 | $Nb_2O_5$ | 117.73 |
| 10 | $SiO_2$ | 178.49 |
| 11 | $Nb_2O_5$ | 81.65 |
| 12 | $SiO_2$ | 25.72 |
| 13 | $Nb_2O_5$ | 13.97 |
| 14 | $SiO_2$ | 94.61 |
| 15 | $Nb_2O_5$ | 107.3 |
| 16 | $SiO_2$ | 94.61 |
| 17 | $Nb_2O_5$ | 17.27 |
| 18 | $SiO_2$ | 27.71 |
| 19 | $Nb_2O_5$ | 65.51 |
| 20 | $SiO_2$ | 166.98 |
| 21 | $Nb_2O_5$ | 82.61 |
| 22 | $SiO_2$ | 18.84 |
| 23 | $Nb_2O_5$ | 6.12 |
| 24 | $SiO_2$ | 141.84 |
| 25 | $Nb_2O_5$ | 111.58 |
| 26 | $SiO_2$ | 186.03 |
| 27 | $Nb_2O_5$ | 114.89 |
| 28 | $SiO_2$ | 181.17 |
| 29 | $Nb_2O_5$ | 107.64 |
| 30 | $SiO_2$ | 171.21 |
| 31 | $Nb_2O_5$ | 106.24 |
| 32 | $SiO_2$ | 177.15 |
| 33 | $Nb_2O_5$ | 111.76 |
| 34 | $SiO_2$ | 178.75 |
| 35 | $Nb_2O_5$ | 107.76 |

TABLE 1-continued

| Layer No. | Material | Thickness (nm) |
|---|---|---|
| 36 | SiO$_2$ | 172.17 |
| 37 | Nb$_2$O$_5$ | 106.86 |
| 38 | SiO$_2$ | 177.85 |
| 39 | Nb$_2$O$_5$ | 111.19 |
| 40 | SiO$_2$ | 179.91 |
| 41 | Nb$_2$O$_5$ | 109.11 |
| 42 | SiO$_2$ | 173.39 |
| 43 | Nb$_2$O$_5$ | 106.95 |
| 44 | SiO$_2$ | 176.5 |
| 45 | Nb$_2$O$_5$ | 110.69 |
| 46 | SiO$_2$ | 175.54 |
| 47 | Nb$_2$O$_5$ | 105.87 |
| 48 | SiO$_2$ | 171.34 |
| 49 | Nb$_2$O$_5$ | 108.56 |
| 50 | SiO$_2$ | 179.16 |
| 51 | Nb$_2$O$_5$ | 106.29 |
| 52 | SiO$_2$ | 161.47 |
| 53 | Nb$_2$O$_5$ | 10.28 |
| 54 | SiO$_2$ | 6.92 |
| 55 | Nb$_2$O$_5$ | 78.32 |
| 56 | SiO$_2$ | 79.6 |

Figure 4:
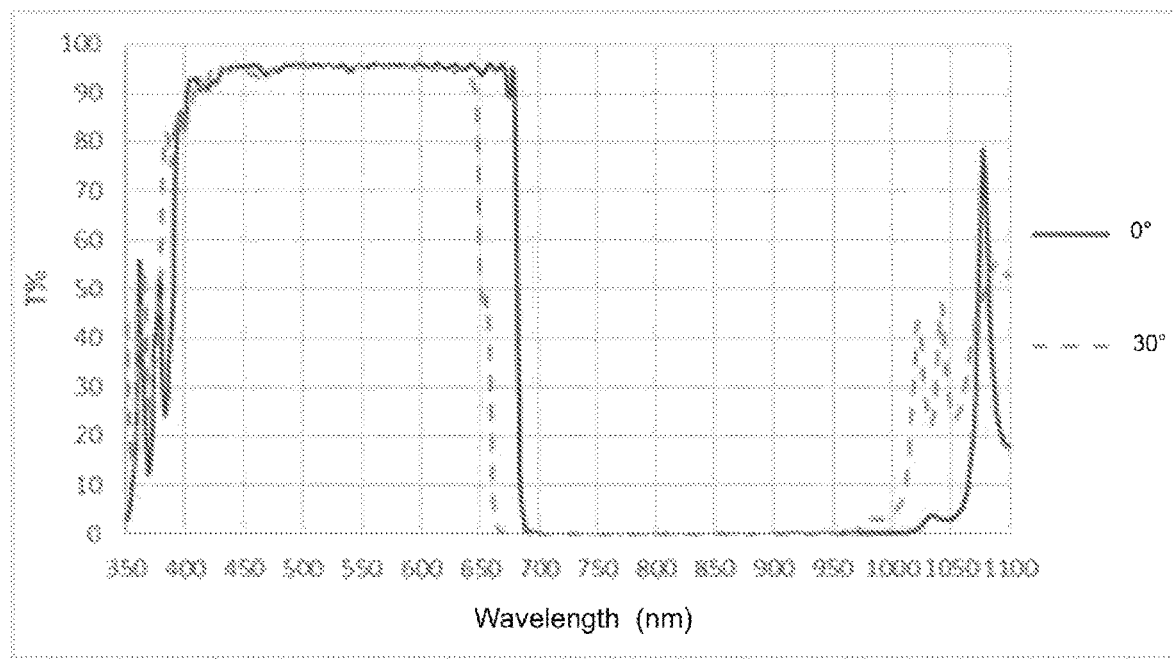
FIG. 4 is a transmittance spectrum diagram of a second multilayer film according to the present invention.
Figure 5:
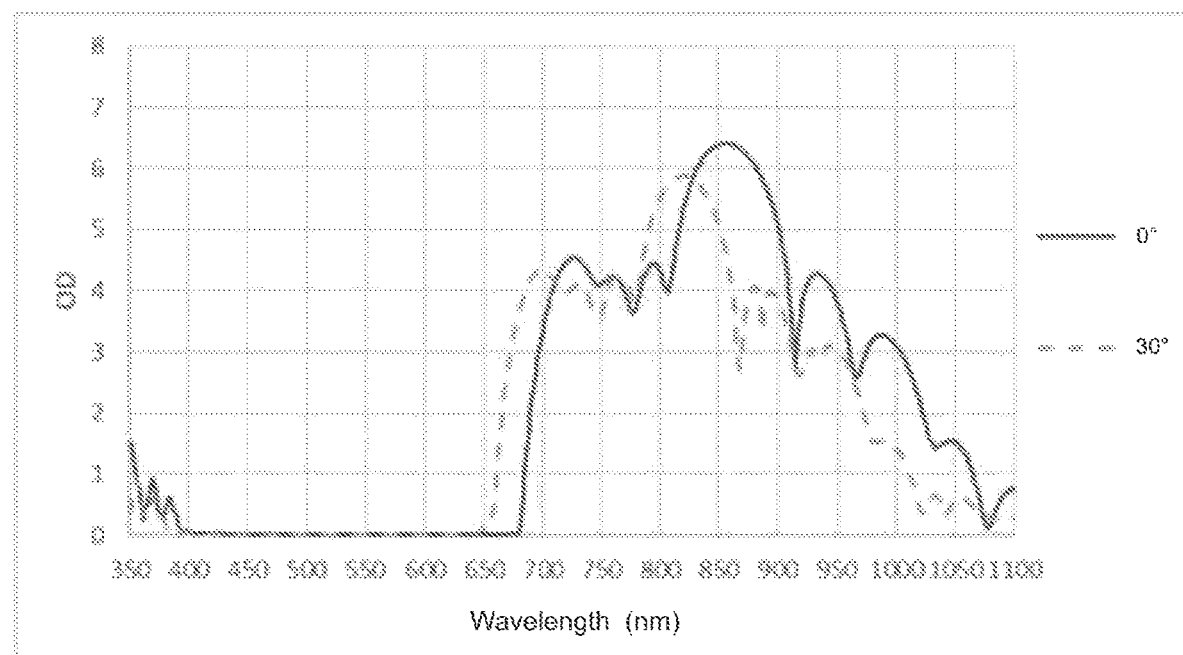
FIG. 5 is an optical density spectrum of a second multilayer film according to the present invention.

In an embodiment, with reference to FIG. 4 and FIG. 5, the second multilayer film 30, is fabricated by the PVD (physical vapor deposition) process. In an embodiment, the second multilayer film is formed on the lower side of the glass substrate 10. In an embodiment, the second multilayer film is formed by stacking alternately a plurality of high-refractive-index layers and a plurality of low-refractive-index layers. In an embodiment, the first multilayer film 30 has an optical density of 3~6 (OD3~OD6) for light with a wavelength of 700 nm to 900 nm.

In an embodiment, the high-refractive-index material is an oxide comprising one of trititanium pentoxide (Ti3O5), titanium dioxide (TiO2), tantalum pentoxide (Ta2O5), niobium pentoxide (Nb2O5) or a mixture thereof. In an embodiment, the high-refractive-index material has a refractive index of 2~3, and preferably has an extinction coefficient close to zero for light with a wavelength of 300 nm to 1100 nm.

In an embodiment, the low-refractive-index material is an oxide comprising one of silicon dioxide (SiO2), magnesium fluoride (MgF2) or a mixture thereof. In an embodiment, the low-refractive-index material has a refractive index of 1.3~2, and preferably has an extinction coefficient close to zero for light with a wavelength of 300 nm to 1100 nm. In an exemplary embodiment of the present invention, the second multilayer film 20 is formed so that the structure of the second multilayer film is as shown in the following table:

TABLE 2

| Layer No. | Material | Thickness (nm) |
|---|---|---|
| 1 | Nb$_2$O$_5$ | 8.55 |
| 2 | SiO$_2$ | 33.83 |
| 3 | Nb$_2$O$_5$ | 96.95 |
| 4 | SiO$_2$ | 150.53 |
| 5 | Nb$_2$O$_5$ | 85.43 |
| 6 | SiO$_2$ | 140.59 |
| 7 | Nb$_2$O$_5$ | 83.01 |
| 8 | SiO$_2$ | 138.23 |
| 9 | Nb$_2$O$_5$ | 82.05 |
| 10 | SiO$_2$ | 137.33 |
| 11 | Nb$_2$O$_5$ | 81.52 |
| 12 | SiO$_2$ | 136.92 |
| 13 | Nb$_2$O$_5$ | 81.13 |
| 14 | SiO$_2$ | 136.71 |
| 15 | Nb$_2$O$_5$ | 80.86 |
| 16 | SiO$_2$ | 136.59 |

TABLE 2-continued

| Layer No. | Material | Thickness (nm) |
|---|---|---|
| 17 | Nb$_2$O$_5$ | 80.79 |
| 18 | SiO$_2$ | 136.59 |
| 19 | Nb$_2$O$_5$ | 80.88 |
| 20 | SiO$_2$ | 136.64 |
| 21 | Nb$_2$O$_5$ | 81.1 |
| 22 | SiO$_2$ | 136.71 |
| 23 | Nb$_2$O$_5$ | 81.4 |
| 24 | SiO$_2$ | 136.9 |
| 25 | Nb$_2$O$_5$ | 81.91 |
| 26 | SiO$_2$ | 137.52 |
| 27 | Nb$_2$O$_5$ | 83.45 |
| 28 | SiO$_2$ | 140.24 |
| 29 | Nb$_2$O$_5$ | 91.16 |
| 30 | SiO$_2$ | 143.89 |
| 31 | Nb$_2$O$_5$ | 7.37 |
| 32 | SiO$_2$ | 22.5 |
| 33 | Nb$_2$O$_5$ | 109.53 |
| 34 | SiO$_2$ | 17.04 |
| 35 | Nb$_2$O$_5$ | 8.4 |
| 36 | SiO$_2$ | 150.36 |
| 37 | Nb$_2$O$_5$ | 90.99 |
| 38 | SiO$_2$ | 143.06 |
| 39 | Nb$_2$O$_5$ | 85.75 |
| 40 | SiO$_2$ | 144.98 |
| 41 | Nb$_2$O$_5$ | 93.4 |
| 42 | SiO$_2$ | 169.43 |
| 43 | Nb$_2$O$_5$ | 20.65 |
| 44 | SiO$_2$ | 8.12 |
| 45 | Nb$_2$O$_5$ | 87.28 |
| 46 | SiO$_2$ | 22.4 |
| 47 | Nb$_2$O$_5$ | 5.77 |
| 48 | SiO$_2$ | 142.34 |
| 49 | Nb$_2$O$_5$ | 94.13 |
| 50 | SiO$_2$ | 147.82 |
| 51 | Nb$_2$O$_5$ | 92.71 |
| 52 | SiO$_2$ | 164.87 |
| 53 | Nb$_2$O$_5$ | 105.22 |
| 54 | SiO$_2$ | 17.91 |
| 55 | Nb$_2$O$_5$ | 3.43 |
| 56 | SiO$_2$ | 154.31 |
| 57 | Nb$_2$O$_5$ | 99.34 |
| 58 | SiO$_2$ | 143.15 |
| 59 | Nb$_2$O$_5$ | 7.18 |
| 60 | SiO$_2$ | 10.55 |
| 61 | Nb$_2$O$_5$ | 77.66 |
| 62 | SiO$_2$ | 74.8 |

In an embodiment, the infrared-cut filter according to the present invention has an extremely low transmittance of 0.1%~0.00001% for light with an infrared wavelength range of 700 nm to 1100 nm. Therefore, the infrared-cut filter of the present invention can effectively filter out infrared light and transmit visible light to produce normal colored images, thus meeting the stringent requirements of high-end cell phone camera modules.

Figure 6:
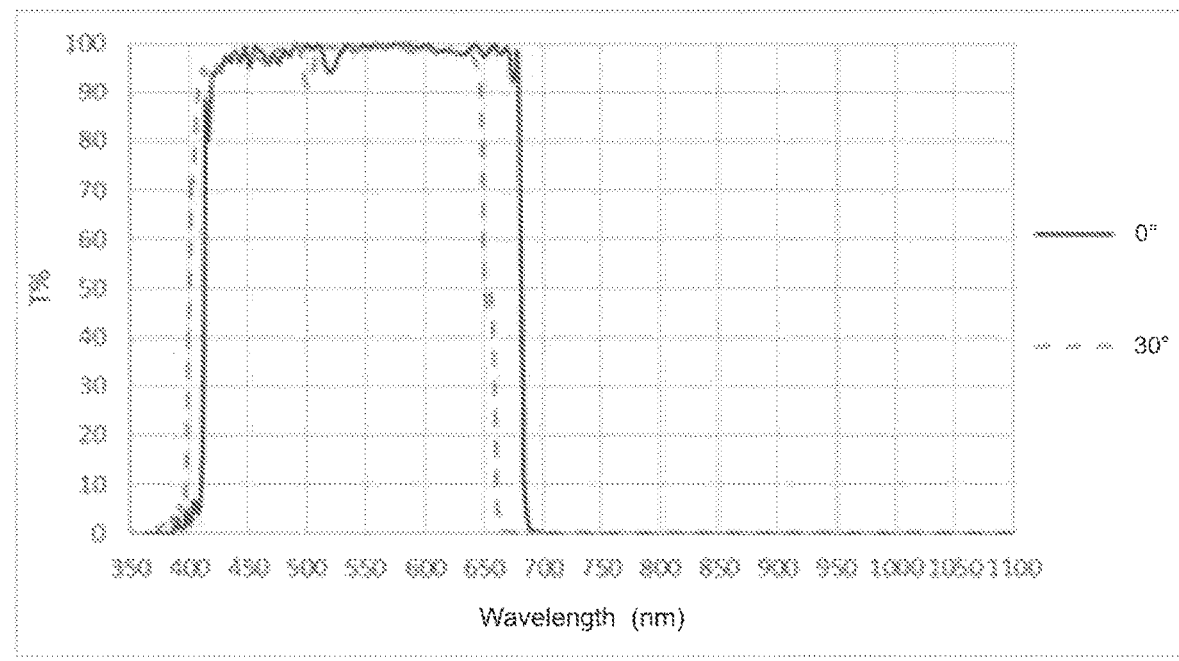
FIG. 6 is a transmittance spectrum diagram of an infrared-cut filter when the glass substrate is a white glass substrate according to the present invention.
Figure 7:
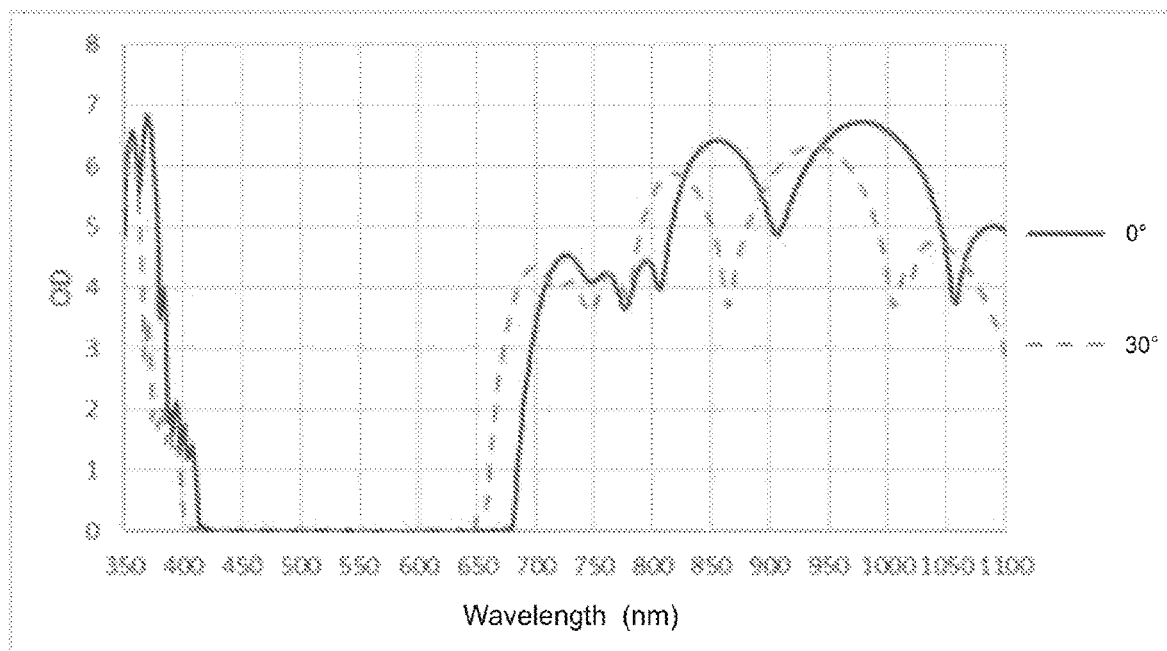
FIG. 7 is an optical density spectrum of an infrared-cut filter when the glass substrate is a white glass substrate according to the present invention.

In a preferred embodiment of the present invention, with reference to FIG. 6 and FIG. 7, an infrared-cut filter according to the present invention has a glass substrate 10, which is white glass, a first multilayer film 20 on the upper side of the glass substrate, and a second multilayer film 30 on the lower side of the glass substrate, and has a transmittance spectrum as shown in FIG. 6 and an optical density spectrum as shown in FIG. 7.

Figure 8:
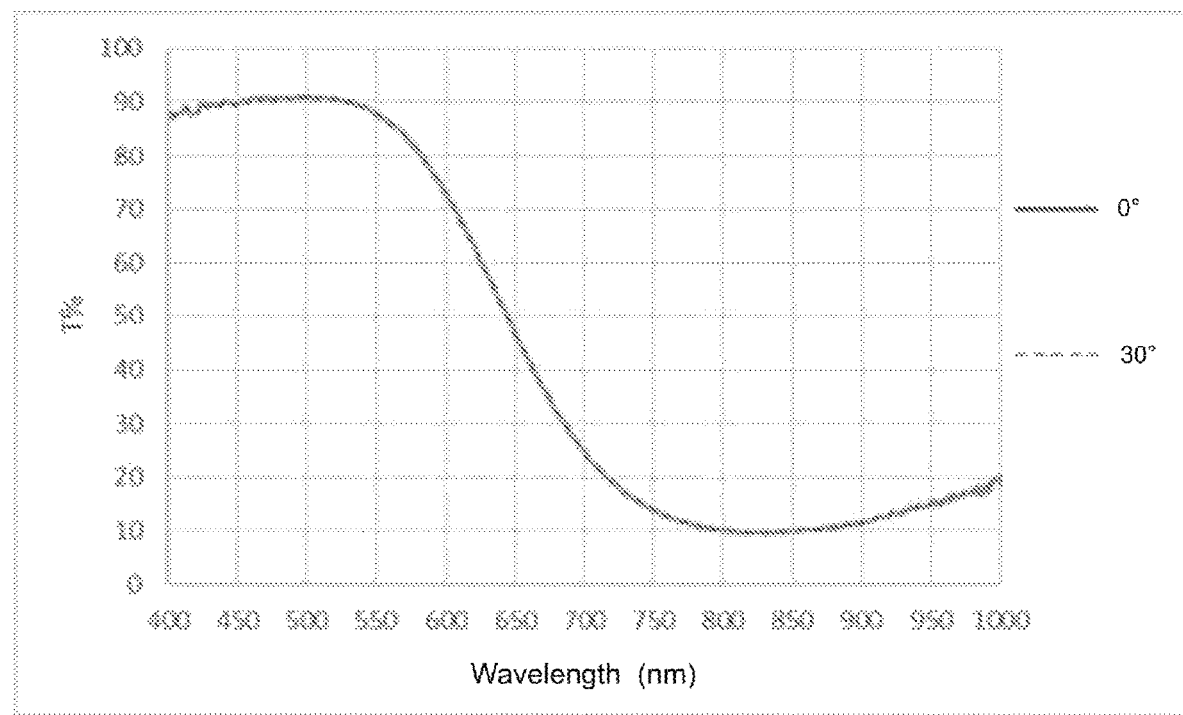
FIG. 8 is a transmittance spectrum diagram of a blue glass substrate according to the present invention.
Figure 9:
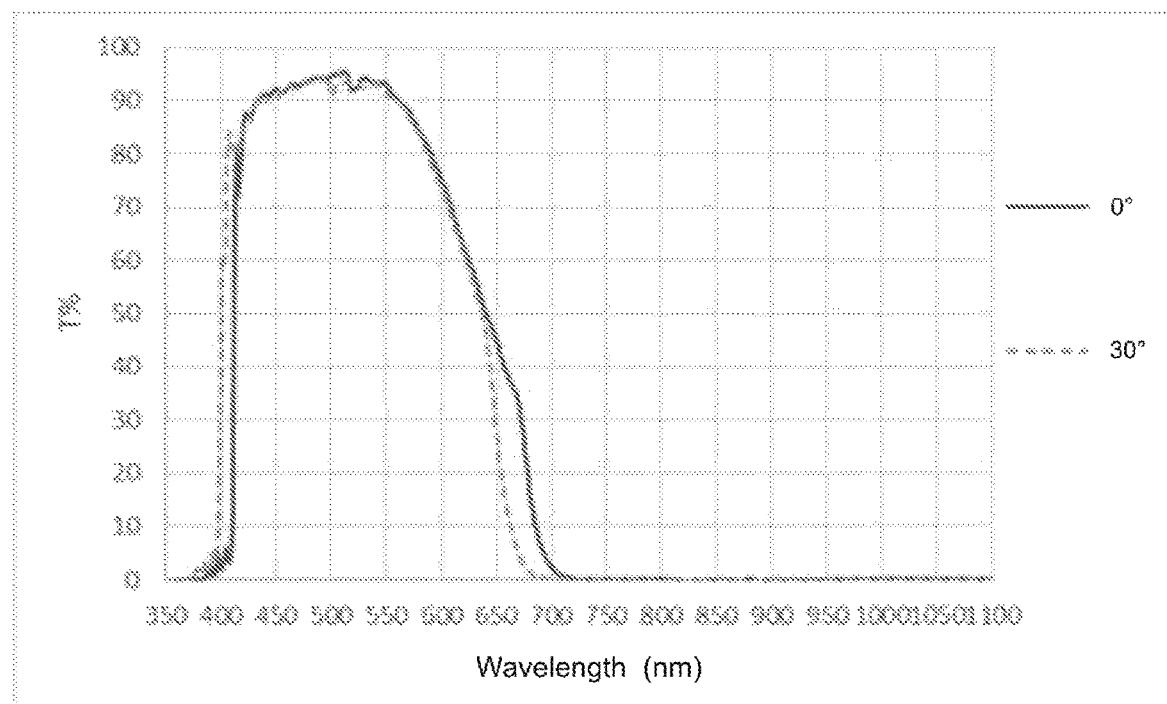
FIG. 9 is a transmittance spectrum diagram of an infrared-cut filter when the glass substrate is a blue glass substrate according to the present invention.
Figure 10:
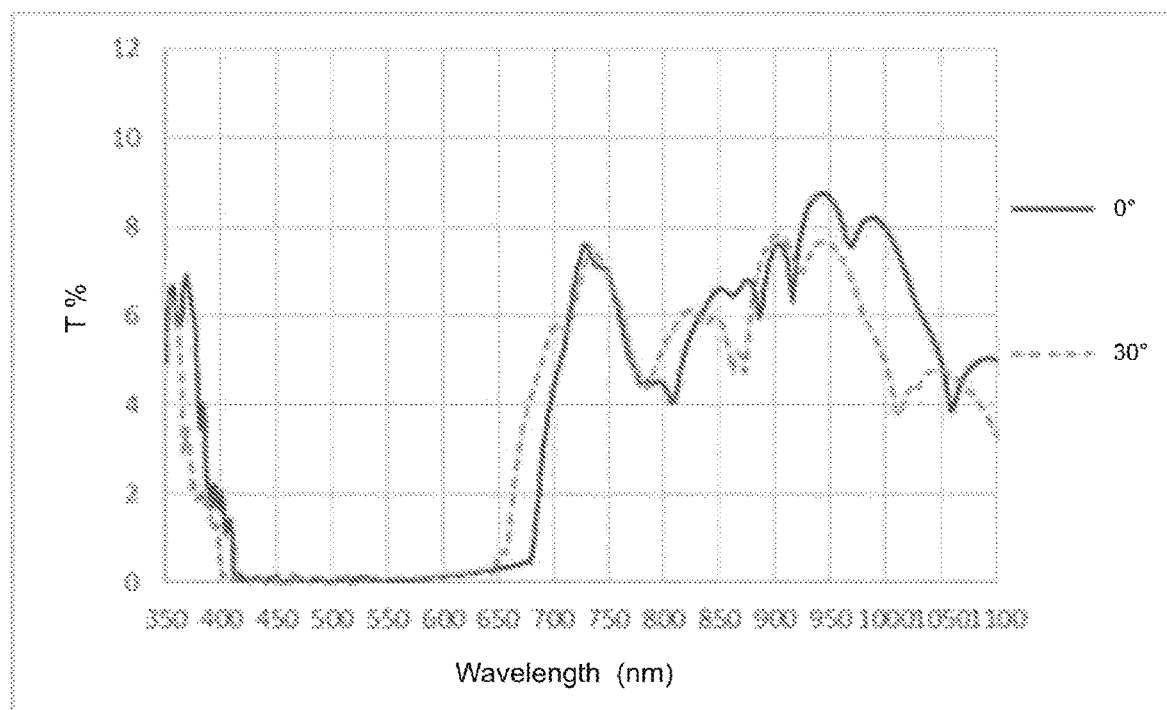
FIG. 10 is an optical density spectrum of an infrared-cut filter when the glass substrate is a blue glass substrate according to the present invention.

In a preferred embodiment of the present invention, with reference to FIG. 9 and FIG. 10, an infrared-cut filter according to the present invention has a glass substrate 10, which is blue glass, a first multilayer film 20 on the upper side of the glass substrate, and a second multilayer film 30 on the lower side of the glass substrate, and has a transmittance spectrum as shown in FIG. 9 and an optical density spectrum as shown in FIG. 10. In an embodiment, as shown in FIG. 8, a filter response is provided showing the transmittance spectrum of a blue glass substrate itself, which shows that the blue glass substrate is a near-infrared light absorbing material, whose cutoff wavelength (where the transmittance reaches 50% of the peak) is around 640 nm±10 nm, and there is very little deviation on the level of transmittance, when an incident light angle varies from 0° to 30°.

Figure 11:
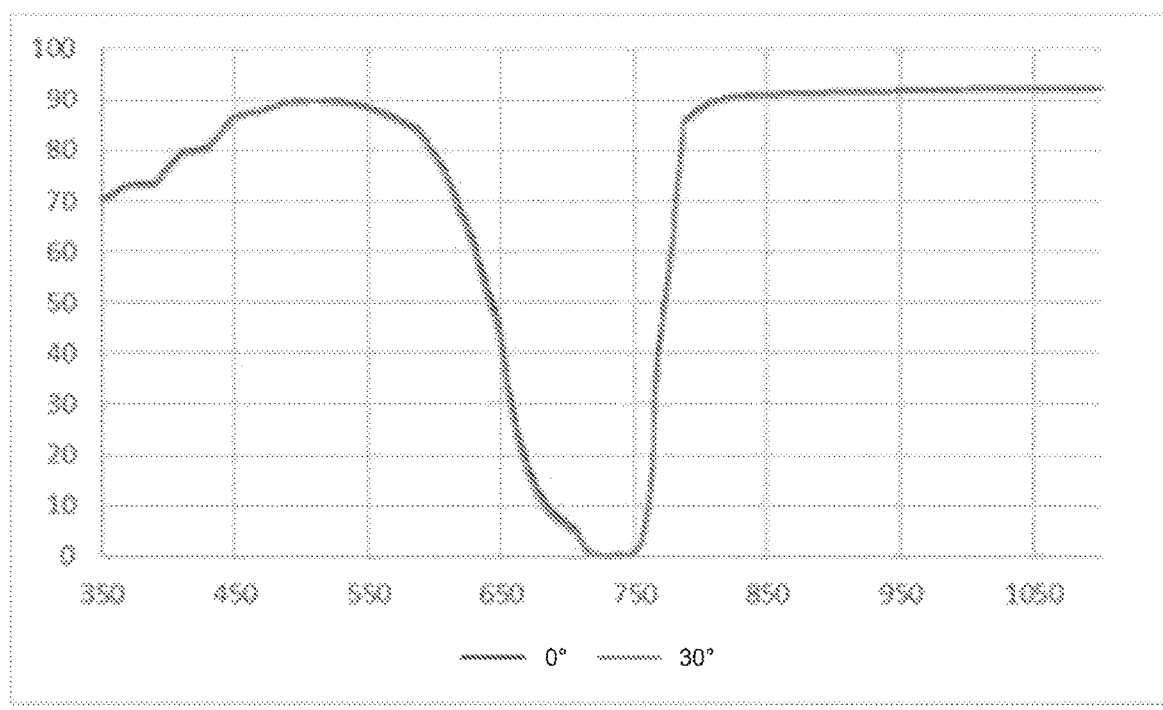
FIG. 11 is a transmittance spectrum diagram of a substrate comprising white glass coated with an infrared-absorbing organic film according to the present invention.
Figure 12:
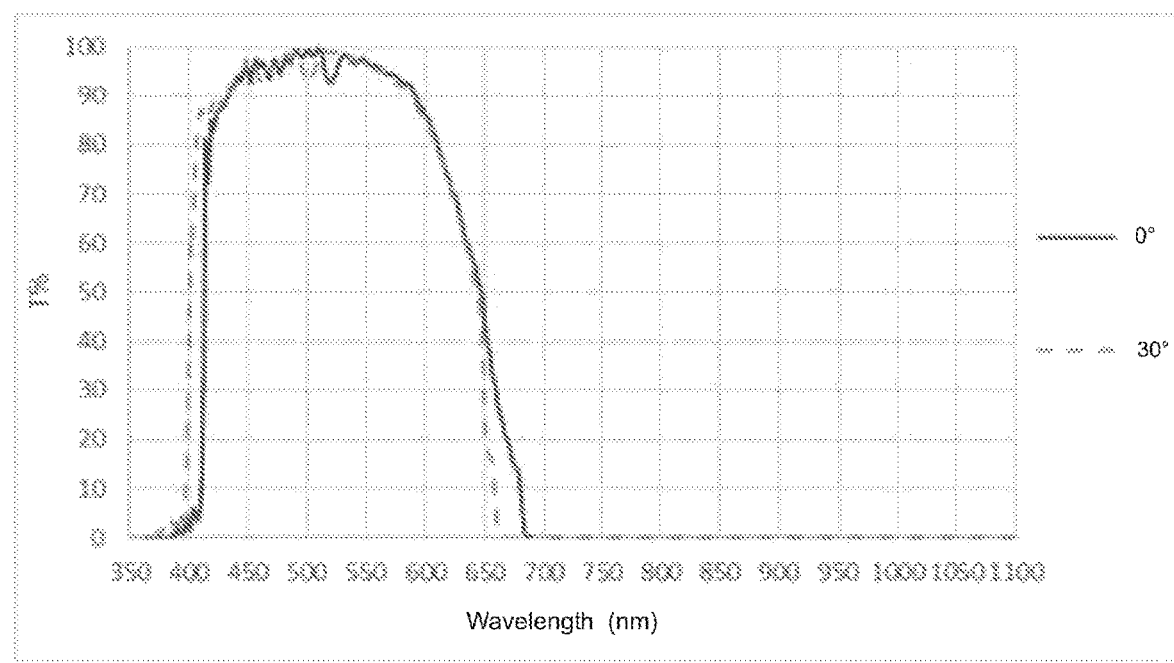
FIG. 12 is a transmittance spectrum diagram of an infrared-cut filter when the glass substrate is a substrate comprising white glass coated with an infrared-absorbing organic film according to the present invention.
Figure 13:
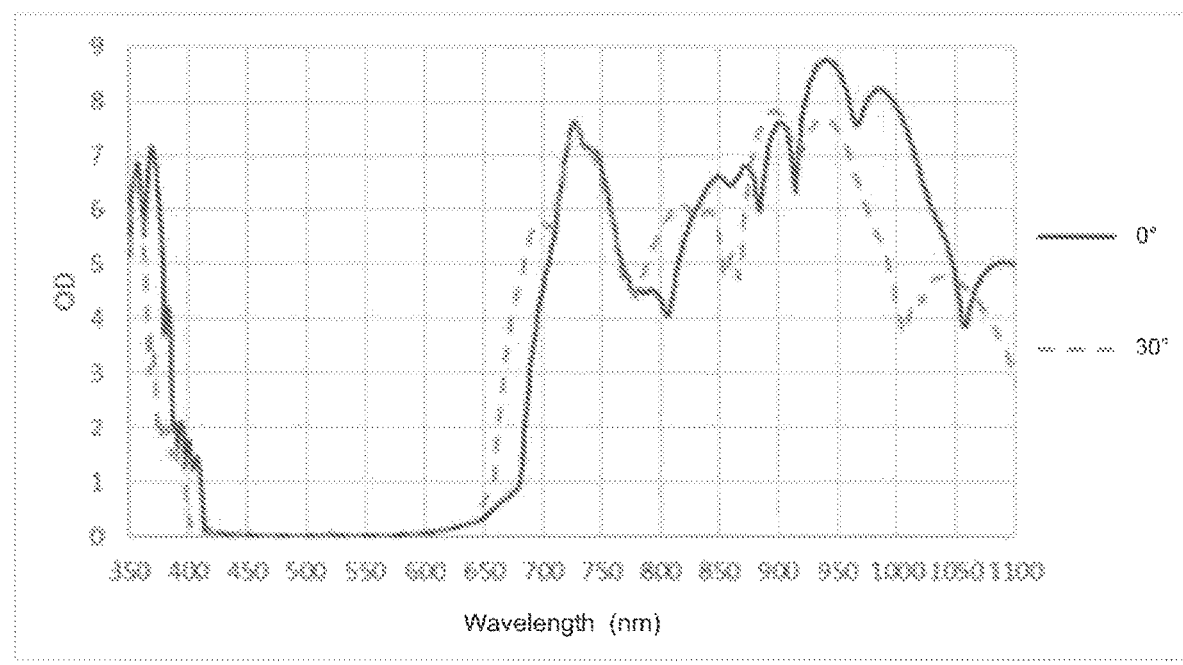
FIG. 13 is an optical density spectrum of an infrared-cut filter when the glass substrate is a substrate comprising white glass coated with an infrared-absorbing organic film according to the present invention.

In a preferred embodiment of the present invention, with reference to FIG. 12 and FIG. 13, an infrared-cut filter according to the present invention has a glass substrate 10, which is a substrate comprising white glass coated with an infrared-absorbing organic film, a first multilayer film 20 on the upper side of the glass substrate, and a second multilayer film 30 on the lower side of the glass substrate, and has a transmittance spectrum as shown in FIG. 12 and an optical density spectrum as shown in FIG. 13. In an embodiment, the infrared-cut filter of this preferred embodiment has an optical density of 3~6 (OD3~OD6) and a deviation of transmittance level of 50% (T50%) less than 5 nm for light over a wavelength range of 700 nm to 1100 nm. In an embodiment, as shown in FIG. 11, a filter response is provided showing the transmittance spectrum of the substrate comprising white glass coated with an infrared-absorbing organic film used in this preferred embodiment, in which shows that this substrate is a near-infrared light absorbing material with a transmittance level of 50% for light with a wavelength around 640 nm±10 nm, and with a transmittance deviation when the angle of incidence changes from 0° to 30° which is negligibly small.

It is understood that when an element is referred hereinabove as being "on" another element, it can be directly on the other element or intervening elements may be present therebetween. In contrast, when an element is referred to as being "directly on" another element, there are no intervening elements present.

Moreover, any components or materials can be formed from a same, structurally continuous piece or separately fabricated and connected.

It is further understood that, although ordinal terms, such as, "first," "second," and "third," are used herein to describe various elements, components, regions, layers and/or sections, these elements, components, regions, layers and/or sections should not be limited by these terms. These terms are only used to distinguish one element, component, region, layer and/or section from another element, component, region, layer and/or section. Thus, a "first element," "component," "region," "layer" and/or "section" discussed below could be termed a second element, component, region, layer and/or section without departing from the teachings herein.

Features illustrated or described as part of one embodiment can be used with another embodiment and such variations come within the scope of the appended claims and their equivalents.

Spatially relative terms, such as "beneath," "below," "lower," "above," "upper" and the like, are used herein for ease of description to describe one element or feature's relationship to another element(s) or feature(s) as illustrated in the figures. It is understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device can be otherwise oriented (rotated 90 degrees or at other orientations) and the spatially relative descriptors used herein interpreted accordingly.

Example embodiments are described herein with reference to cross section illustrations that are schematic illustrations of idealized embodiments. As such, variations from the shapes of the illustrations, for example, of manufacturing techniques and/or tolerances, are to be expected. Thus, example embodiments described herein should not be construed as limited to the particular shapes of regions as illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

In conclusion, herein is presented an infrared-cut filter structure. The disclosure is illustrated by example in the drawing figures, and throughout the written description. It should be understood that numerous variations are possible while adhering to the inventive concept. Such variations are contemplated as being a part of the present disclosure.

What is claimed is:

1. An infrared-cut filter structure, comprising:
   a glass substrate having an upper side and a lower side;
   a first multilayer film on the upper side of the glass substrate; and
   a second multilayer film on the lower side of the glass substrate,
   wherein the first multilayer film is formed by alternately stacking a plurality of high-refractive-index layers and a plurality of low-refractive-index layers, such that the first multilayer film has an optical density between OD3~OD7 for infrared light with a wavelength of 900 nm to 1100 nm and an angle of incidence of 0° through 30°, and
   wherein the second multilayer film is formed by alternately stacking a plurality of high-refractive-index layers and a plurality of low-refractive-index layers, such that the second multilayer film has an optical density between OD3~OD6 for infrared light with a wavelength of 700 nm to 900 nm.

2. The infrared-cut filter structure of claim 1, wherein the glass substrate is a white glass substrate.

3. The infrared-cut filter structure of claim 1, wherein the glass substrate is a blue glass substrate.

4. The infrared-cut filter structure of claim 1, wherein the glass substrate is a substrate comprising white glass coated with an infrared-absorbing organic film.

5. The infrared-cut filter structure of claim 1, wherein the plurality of high-refractive-index layers of the first multilayer film are each composed of a material selected from the group consisting of: trititanium pentoxide ($Ti_3O_5$), titanium dioxide ($TiO_2$), tantalum pentoxide ($Ta_2O_5$), niobium pentoxide ($Nb_2O_5$), and mixtures thereof.

6. The infrared-cut filter structure of claim 1, wherein the plurality of low-refractive-index layers of the first multilayer film are each composed of a material selected from the group consisting of: silicon dioxide ($SiO_2$), magnesium fluoride ($MgF_2$), and mixtures thereof.

7. The infrared-cut filter structure of claim 1, wherein the plurality of high-refractive-index layers of the second multilayer film are each composed of a material selected from the group consisting of: trititanium pentoxide ($Ti_3O_5$), titanium dioxide ($TiO_2$), tantalum pentoxide ($Ta_2O_5$), niobium pentoxide ($Nb_2O_5$), and mixtures thereof.

8. The infrared-cut filter structure of claim 1, wherein the plurality of low-refractive-index layers of the second multilayer film are each composed of a material selected from the group consisting of: silicon dioxide ($SiO_2$), magnesium fluoride ($MgF_2$), and mixtures thereof.

9. The infrared-cut filter structure of claim 1, wherein the first multilayer film is formed so that it has the structure in the following table:

| Layer No. | Material | Thickness (nm) |
| --- | --- | --- |
| 1 | $Nb_2O_5$ | 12.74 |
| 2 | $SiO_2$ | 32.84 |
| 3 | $Nb_2O_5$ | 96.19 |
| 4 | $SiO_2$ | 10.31 |
| 5 | $Nb_2O_5$ | 8.45 |
| 6 | $SiO_2$ | 157.12 |
| 7 | $Nb_2O_5$ | 106.84 |
| 8 | $SiO_2$ | 183.37 |
| 9 | $Nb_2O_5$ | 117.73 |
| 10 | $SiO_2$ | 178.49 |
| 11 | $Nb_2O_5$ | 81.65 |
| 12 | $SiO_2$ | 25.72 |
| 13 | $Nb_2O_5$ | 13.97 |
| 14 | $SiO_2$ | 94.61 |
| 15 | $Nb_2O_5$ | 107.3 |
| 16 | $SiO_2$ | 94.61 |
| 17 | $Nb_2O_5$ | 17.27 |
| 18 | $SiO_2$ | 27.71 |
| 19 | $Nb_2O_5$ | 65.51 |
| 20 | $SiO_2$ | 166.98 |
| 21 | $Nb_2O_5$ | 82.61 |
| 22 | $SiO_2$ | 18.84 |
| 23 | $Nb_2O_5$ | 6.12 |
| 24 | $SiO_2$ | 141.84 |
| 25 | $Nb_2O_5$ | 111.58 |
| 26 | $SiO_2$ | 186.03 |
| 27 | $Nb_2O_5$ | 114.89 |
| 28 | $SiO_2$ | 181.17 |
| 29 | $Nb_2O_5$ | 107.64 |
| 30 | $SiO_2$ | 171.21 |
| 31 | $Nb_2O_5$ | 106.24 |
| 32 | $SiO_2$ | 177.15 |
| 33 | $Nb_2O_5$ | 111.76 |
| 34 | $SiO_2$ | 178.75 |
| 35 | $Nb_2O_5$ | 107.76 |
| 36 | $SiO_2$ | 172.17 |
| 37 | $Nb_2O_5$ | 106.86 |
| 38 | $SiO_2$ | 177.85 |
| 39 | $Nb_2O_5$ | 111.19 |
| 40 | $SiO_2$ | 179.91 |
| 41 | $Nb_2O_5$ | 109.11 |
| 42 | $SiO_2$ | 173.39 |
| 43 | $Nb_2O_5$ | 106.95 |
| 44 | $SiO_2$ | 176.5 |
| 45 | $Nb_2O_5$ | 110.69 |
| 46 | $SiO_2$ | 175.54 |
| 47 | $Nb_2O_5$ | 105.87 |
| 48 | $SiO_2$ | 171.34 |
| 49 | $Nb_2O_5$ | 108.56 |
| 50 | $SiO_2$ | 179.16 |
| 51 | $Nb_2O_5$ | 106.29 |
| 52 | $SiO_2$ | 161.47 |
| 53 | $Nb_2O_5$ | 10.28 |
| 54 | $SiO_2$ | 6.92 |
| 55 | $Nb_2O_5$ | 78.32 |
| 56 | $SiO_2$ | 79.6 | and wherein the second multilayer film is formed so that it has the structure shown in the following table:

| Layer No. | Material | Thickness (nm) |
| --- | --- | --- |
| 1 | $Nb_2O_5$ | 8.55 |
| 2 | $SiO_2$ | 33.83 |
| 3 | $Nb_2O_5$ | 96.95 |
| 4 | $SiO_2$ | 150.53 |
| 5 | $Nb_2O_5$ | 85.43 |
| 6 | $SiO_2$ | 140.59 |
| 7 | $Nb_2O_5$ | 83.01 |
| 8 | $SiO_2$ | 138.23 |
| 9 | $Nb_2O_5$ | 82.05 |
| 10 | $SiO_2$ | 137.33 |
| 11 | $Nb_2O_5$ | 81.52 |
| 12 | $SiO_2$ | 136.92 |
| 13 | $Nb_2O_5$ | 81.13 |
| 14 | $SiO_2$ | 136.71 |
| 15 | $Nb_2O_5$ | 80.86 |
| 16 | $SiO_2$ | 136.59 |
| 17 | $Nb_2O_5$ | 80.79 |
| 18 | $SiO_2$ | 136.59 |
| 19 | $Nb_2O_5$ | 80.88 |
| 20 | $SiO_2$ | 136.64 |
| 21 | $Nb_2O_5$ | 81.1 |
| 22 | $SiO_2$ | 136.71 |
| 23 | $Nb_2O_5$ | 81.4 |
| 24 | $SiO_2$ | 136.9 |
| 25 | $Nb_2O_5$ | 81.91 |
| 26 | $SiO_2$ | 137.52 |
| 27 | $Nb_2O_5$ | 83.45 |
| 28 | $SiO_2$ | 140.24 |
| 29 | $Nb_2O_5$ | 91.16 |
| 30 | $SiO_2$ | 143.89 |
| 31 | $Nb_2O_5$ | 7.37 |
| 32 | $SiO_2$ | 22.5 |
| 33 | $Nb_2O_5$ | 109.53 |
| 34 | $SiO_2$ | 17.04 |
| 35 | $Nb_2O_5$ | 8.4 |
| 36 | $SiO_2$ | 150.36 |
| 37 | $Nb_2O_5$ | 90.99 |
| 38 | $SiO_2$ | 143.06 |
| 39 | $Nb_2O_5$ | 85.75 |
| 40 | $SiO_2$ | 144.98 |
| 41 | $Nb_2O_5$ | 93.4 |
| 42 | $SiO_2$ | 169.43 |
| 43 | $Nb_2O_5$ | 20.65 |
| 44 | $SiO_2$ | 8.12 |
| 45 | $Nb_2O_5$ | 87.28 |
| 46 | $SiO_2$ | 22.4 |
| 47 | $Nb_2O_5$ | 5.77 |
| 48 | $SiO_2$ | 142.34 |
| 49 | $Nb_2O_5$ | 94.13 |
| 50 | $SiO_2$ | 147.82 |
| 51 | $Nb_2O_5$ | 92.71 |
| 52 | $SiO_2$ | 164.87 |
| 53 | $Nb_2O_5$ | 105.22 |
| 54 | $SiO_2$ | 17.91 |
| 55 | $Nb_2O_5$ | 3.43 |
| 56 | $SiO_2$ | 154.31 |

-continued

| Layer No. | Material | Thickness (nm) |
|---|---|---|
| 57 | Nb$_2$O$_5$ | 99.34 |
| 58 | SiO$_2$ | 143.15 |
| 59 | Nb$_2$O$_5$ | 7.18 |
| 60 | SiO$_2$ | 10.55 |
| 61 | Nb$_2$O$_5$ | 77.66 |
| 62 | SiO$_2$ | 74.8 |

* * * * *